(12) United States Patent
Sawada et al.

(10) Patent No.: US 9,997,327 B1
(45) Date of Patent: Jun. 12, 2018

(54) LINER TUBE AND ELECTRON MICROSCOPE

(71) Applicant: JEOL Ltd., Tokyo (JP)

(72) Inventors: Hidetaka Sawada, Tokyo (JP); Yu Jimbo, Tokyo (JP); Masashi Shimizu, Tokyo (JP)

(73) Assignee: JEOL Ltd. (JP)

( * ) Notice: Subject to any disclaimer, the term of this patent is extended or adjusted under 35 U.S.C. 154(b) by 0 days. days.

(21) Appl. No.: 15/372,536

(22) Filed: Dec. 8, 2016

(51) Int. Cl.
*H01J 37/00* (2006.01)
*H01J 37/153* (2006.01)
*H01J 37/26* (2006.01)
*H01J 37/22* (2006.01)
*H01J 37/10* (2006.01)
*H01J 37/147* (2006.01)

(52) U.S. Cl.
CPC ............ *H01J 37/153* (2013.01); *H01J 37/10* (2013.01); *H01J 37/1474* (2013.01); *H01J 37/22* (2013.01); *H01J 37/26* (2013.01); *H01J 2237/1534* (2013.01); *H01J 2237/182* (2013.01)

(58) Field of Classification Search
CPC ...... H01J 37/153; H01J 37/10; H01J 37/1474; H01J 37/22; H01J 37/26; H01J 2237/1534; H01J 2237/182
USPC .......................................... 250/306, 307, 311
See application file for complete search history.

(56) References Cited

U.S. PATENT DOCUMENTS

2005/0045821 A1\* 3/2005 Noji ..................... G01N 23/225
250/311

FOREIGN PATENT DOCUMENTS

JP          2011243409 A       12/2011

\* cited by examiner

*Primary Examiner* — Nicole Ippolito
*Assistant Examiner* — Hanway Chang
(74) *Attorney, Agent, or Firm* — The Webb Law Firm (57) ABSTRACT

There is provided a liner tube capable of reducing the effects of magnetic field variations on an electron beam. The liner tube (10) is disposed inside the electron optical column (2) of an electron microscope (100). The interior of the tube (10) forms a path for the electron beam (EB). The liner tube (10) has a first cylindrical member (110) that is made of copper, gold, silver, or an alloy consisting principally of one of these metals.

8 Claims, 12 Drawing Sheets

LINER TUBE AND ELECTRON MICROSCOPE

BACKGROUND OF THE INVENTION

Field of the Invention

The present invention relates to a liner tube and an electron microscope.

Description of Related Art

In recent years, the resolutions of electron microscopes have improved greatly owing to the use of spherical aberration correctors. A spherical aberration corrector has a multipole element which produces a negative spherical aberration to cancel out a positive spherical aberration in an objective lens (see, for example, JP-A-2011-243409). In a spherical aberration corrector, the electron beam creates an orbit spreading out from above the axis within the multipole element in order to produce a sufficiently strong aberration correcting force.

Generally, in an electron microscope, a multipole element constituting a spherical aberration corrector is mounted outside the vacuum. Since an electron beam passes through the vacuum, a liner tube is used. The liner tube is a structure that allows for evacuation of the region through which the electron beam passes while permitting those members (e.g., the multipole element and coils) to be placed outside the vacuum which would degrade the vacuum if placed within the vacuum.

In recent years, the resolutions of electron microscopes have reached 50 pm and so even motions of an electron beam on the order of pm produce noise in a scanning electron microscope (STEM) image. This presents problems in quantitative and other analyses. As described previously, within a multipole element, an electron beam is spread out and located in a plane (reciprocal space) equivalent to the front focal plane relative to the probe (real space). The interior of this plane is sensitive (vulnerable) to disturbances. Quite small noises within this plane due chiefly to magnetic field variations bring about displacements of the electron beam on the order of pm on the sample, thus resulting in noise. Consequently, the resolution of the electron microscope is degraded greatly.

In the vicinity of a multipole element, there are magnetic field variations caused by (a) variations in the deflecting field component due to ripple in currents flowing through coils, (b) external disturbances, and (c) thermal fluctuations produced by the soft magnetic material (such as Permalloy) of the multipole element. In order to achieve the aforementioned stability on the order of pm, it is necessary to reduce the effects of these magnetic field variations on the electron beam.

SUMMARY OF THE INVENTION

In view of the foregoing problem, the present invention has been made. One object associated with some aspects of the present invention is to provide a liner tube capable of reducing the effects of magnetic field variations on an electron beam. Another object associated with some aspects of the invention is to provide an electron microscope capable of reducing the effects of magnetic field variations on an electron beam.

(1) A liner tube associated with the present invention is disposed inside an electron optical column of an electron microscope and has an interior providing a path for an electron beam. The liner tube includes a first cylindrical member made of copper, gold, silver, or an alloy consisting principally of one of these metals.

In this liner tube, the material of the first cylindrical member is copper, gold, silver, or an alloy consisting principally of one of these metals. Therefore, a more effective shield can be provided against varying magnetic fields. Hence, the effects of magnetic field variations on the electron beam passing inside the liner tube can be reduced.

(2) In one feature of this liner tube, there may be further provided a second cylindrical member disposed inside the first cylindrical member. The second cylindrical member may be made of stainless steel or titanium.

This liner tube includes the second cylindrical member disposed inside the first cylindrical member, the second cylinder member being made of stainless steel or titanium. This forms a more effective shield against varying magnetic fields, thus reducing the effects of the magnetic field variations on the electron beam passing inside the liner tube. Also, the mechanical rigidity can be enhanced. Furthermore, degassing, corrosion, and other undesirable phenomena in the vacuum can be prevented.

(3) In one feature of the liner tube of (1) or (2), the first cylindrical member may be made of copper or beryllium copper.

In this liner tube, if the material of the first cylindrical member is copper, the liner tube can be fabricated at lower cost than where the first cylindrical member is made of gold or silver. Furthermore, if the material of the first cylindrical member is beryllium copper, the mechanical rigidity can be enhanced and the liner tube can be fabricated more easily.

(4) An electron microscope associated with the present invention includes a liner tube disposed inside an electron optical column of the microscope. The liner tube has an interior providing a path for an electron beam. The liner tube has a first cylindrical member made of copper, gold, silver, or an alloy consisting principally of one of these metals.

In this electron microscope, the liner tube has the first cylindrical member that is made of copper, gold, silver, or an alloy consisting principally of one of these metals. Therefore, a more effective shield can be provided against varying magnetic fields. The effects of magnetic field variations on the electron beam passing inside the liner tube can be reduced.

(5) In one feature of this electron microscope, there may be further provided an aberration corrector equipped with a multipole element which may have a plurality of polar elements arranged around the first cylindrical member.

In this electron microscope, the first cylindrical member can provide a shield against RF magnetic fields caused by magnetic field variations due to disturbing magnetic fields brought about by ripple in the currents exciting the multipole element, due to external disturbances, or due to thermal noise in the multipole element.

(6) In one feature of the electron microscope of (4) or (5), the liner tube may have a second cylindrical member disposed inside the first cylindrical member. The second cylindrical member may be made of stainless steel or titanium.

In this electron microscope, the liner tube has the second cylindrical member disposed inside the first cylindrical member. The material of the second cylindrical member is stainless steel or titanium. This affords a more effective shield against varying magnetic fields, thus reducing the effects of magnetic field variations on the electron beam passing inside the liner tube. Furthermore, the mechanical rigidity of the liner tube can be enhanced. In addition, degassing, corrosion, and other undesirable phenomena inside the vacuum can be prevented.

(7) In one feature of the electron microscope of any one of (4)-(6), there may be further provided scan coils for scanning the electron beam. The liner tube may have a third cylindrical member made of stainless steel or titanium. The scan coils are arranged around the third cylindrical member.

In this electron microscope, the liner tube has the third cylindrical member which is made of stainless steel or titanium. Therefore, the RF magnetic field produced by the scan coils arranged around the third cylindrical member is not blocked out by the liner tube. Consequently, the electron beam can be scanned precisely.

(8) In one feature of the electron microscope of any one of (4)-(7), the first cylindrical member may be made of copper or beryllium copper.

DESCRIPTION OF THE INVENTION

The preferred embodiments of the present invention are hereinafter described in detail with reference to the drawings. It is to be understood that the embodiments described below are not intended to unduly restrict the content of the present invention delineated by the claims and that not all the configurations described below are essential constituent components of the invention.

1. First Embodiment 1.1. Electron Microscope

Figure 1:
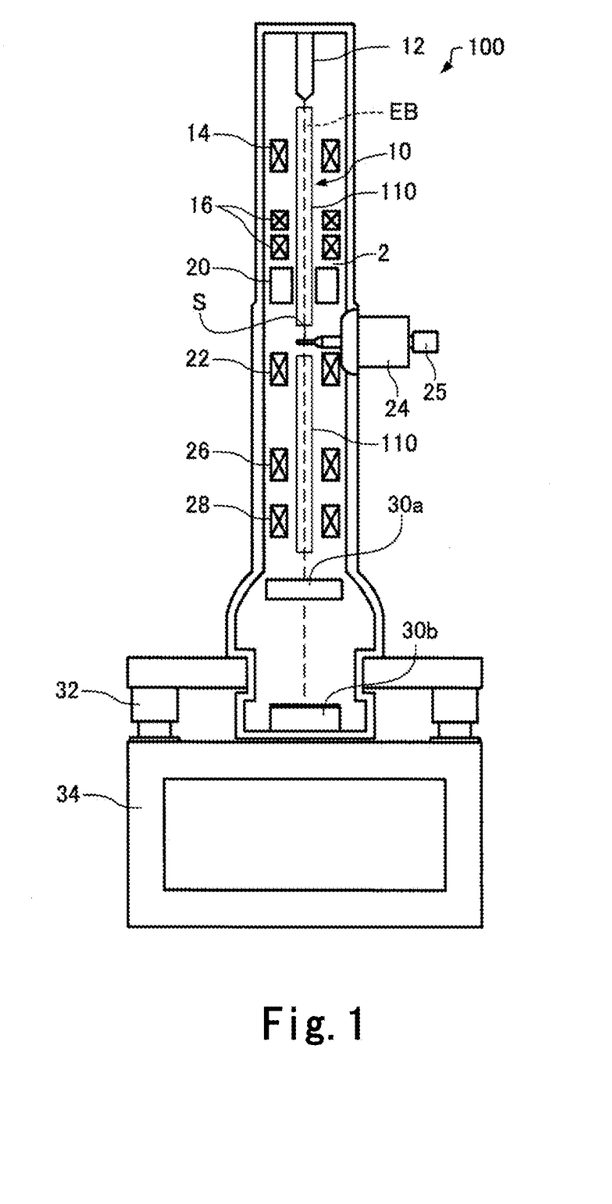
FIG. 1 is a schematic view of an electron microscope associated with a first embodiment of the present invention.

An electron microscope associated with a first embodiment of the present invention is first described by referring to FIG. 1, which schematically shows the electron microscope, 100, associated with the first embodiment.

The electron microscope 100 is a transmission electron microscope (TEM). That is, the electron microscope 100 is an instrument for focusing electrons transmitted through a sample S and obtaining a transmission electron microscope (TEM) image. Furthermore, the electron microscope 100 has scan coils 16 for scanning an electron beam (electron probe) as described later and thus the microscope also acts as a scanning transmission electron microscope (STEM).

Referring still to FIG. 1, the electron microscope 100 includes a liner tube 10, an electron beam source 12, condenser lenses 14, the scan coils 16, an aberration corrector 20, an objective lens 22, a sample stage 24, a sample holder 25, an intermediate lens 26, a projector lens 28, an STEM detector 30a, and an imager 30b. In FIG. 1, the aberration corrector 20 is shown in simplified form.

The electron beam source 12 produces an electron beam EB by accelerating electrons, which are emitted from a cathode, by means of an anode. For example, a well-known electron gun can be used as the electron beam source 12.

The condenser lenses 14 are located behind (i.e., on the downstream side relative to the direction of travel of the electron beam EB) the electron beam source 12. The condenser lenses 14 are used such that the electron beam EB generated by the electron beam source 12 is focused onto the sample S.

The scan coils 16 are positioned behind the condenser lenses 14. The scan coils 16 deflect the electron beam EB to scan the electron beam (electron probe) over the sample S, the beam being focused by the condenser lenses 14 and the objective lens 22 (especially, the top polepiece of the objective lens). The scan coils 16 operate to scan the electron probe over the sample S on the basis of a scan signal generated by a control section (not shown) of the electron microscope 100. In the electron microscope 100, an intensity signal representing the intensity of the electron beam transmitted through the sample S is imaged in synchronism with the scan signal and a scanning transmission electron microscope (STEM) image is obtained.

The aberration corrector 20 is located behind the scan coils 16. Alternatively, the aberration corrector 20 may be positioned ahead of the scan coils 16. The aberration corrector 20 has a multipole element for producing magnetic fields. The aberration corrector 20 corrects aberrations in the illumination system by causing the multipole element to generate given magnetic fields. For instance, the aberration corrector 20 is a spherical aberration corrector for correcting spherical aberration. The aberration corrector 20 corrects the spherical aberration in the illumination system by creating a negative spherical aberration so as to cancel out positive spherical aberration in the illumination system.

The objective lens 22 is located behind the aberration corrector 20. The objective lens 22 is an initial stage of lens for imaging the electron beam EB transmitted through the sample S. Where the electron microscope 100 operates as a scanning transmission electron microscope, the objective lens 22 is used as a lens for forming the electron probe. The objective lens 22 has a top polepiece and a bottom polepiece (both of which are not shown). The objective lens 22 focuses the electron beam EB by producing a magnetic field between the top and bottom polepieces.

The sample stage 24 holds the sample S. In the illustrated example, the sample stage 24 holds the sample S via the sample holder 25. The sample stage 24 places the sample S, for example, between the top and bottom polepieces of the objective lens 22. The sample stage 24 can place the sample S in position by moving and stopping the sample holder 25.

The intermediate lens 26 is placed behind the objective lens 22. The projector lens 28 is located behind the intermediate lens 26. The intermediate lens 26 and projector lens 28 cooperate to further magnify the image focused by the objective lens 22 and to focus the further magnified image onto the imager 30b. Furthermore, the intermediate lens 26 and projector lens 28 can guide the electron beam transmitted through the sample S to the STEM detector 30a. In the electron microscope 100, an imaging system is constituted by the objective lens 22, intermediate lens 26, and projector lens 28.

The STEM detector 30a detects the electron beam transmitted through the sample S. A detection signal representing the electron beam detected by the STEM detector 30a can be imaged in synchronism with the scan signal and thus an STEM image can be obtained. The STEM detector 30a operates also as a dark-field STEM detector for detecting electrons scattered at given angles in the sample S.

The imager 30b captures the TEM image focused by the imaging system. The imager 30b is a digital camera such as a CCD camera or a CMOS camera.

In the illustrated example, the body of the electron microscope is mounted on a pedestal 34 via vibration isolators 32.

The liner tube 10 is disposed inside the electron optical column 2 of the electron microscope 100. In the illustrated example, the liner tube 10 is disposed in both a first region and a second region of the interior of the electron optical column 2. In the first region, there is disposed the illumination system including the condenser lenses 14, scan coils 16, and aberration corrector 20. In the second region, there is disposed the imaging system including the objective lens 22, intermediate lens 26, and projector lens 28. The interior of the liner tube 10 forms a path for the electron microscope EB. The interior of the liner tube 10 is evacuated to a vacuum by vacuum pumping equipment (not shown). A vacuum can be established in the path for the electron beam EB while the lenses 14, 22, 26, 28, scan coils 16, aberration corrector 20, and other components constituting the electron microscope 100 are placed outside the vacuum by means of the liner tube 10.

Figure 2:
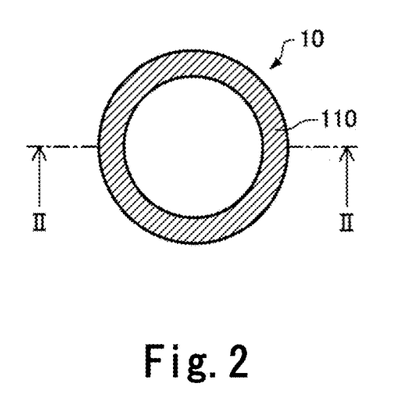
FIG. 2 is a schematic cross-sectional view of a liner tube shown in FIG. 1.
Figure 3:
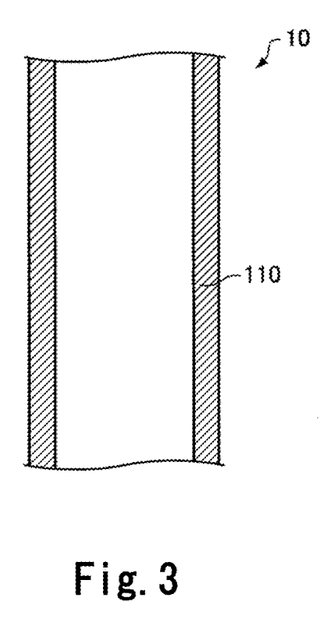
FIG. 3 is a schematic side elevation in cross section of the liner tube of FIG. 2.

FIGS. 2 and 3 are schematic cross sections of the liner tube 10. FIG. 2 shows a cross section perpendicular to the center axis of the liner tube 10. FIG. 3 is a cross section taken along line II-II of FIG. 2.

The liner tube 10 is made of a cylindrical member 110 (hereinafter may also be referred to as the first cylindrical member) as shown in FIGS. 2 and 3. The cylindrical member 110 takes the form of a hollow cylinder. The interior of the cylindrical member 110 forms a path for the electron beam EB. The radius of the liner tube 10 is on the order of mm, for example.

Figure 4:
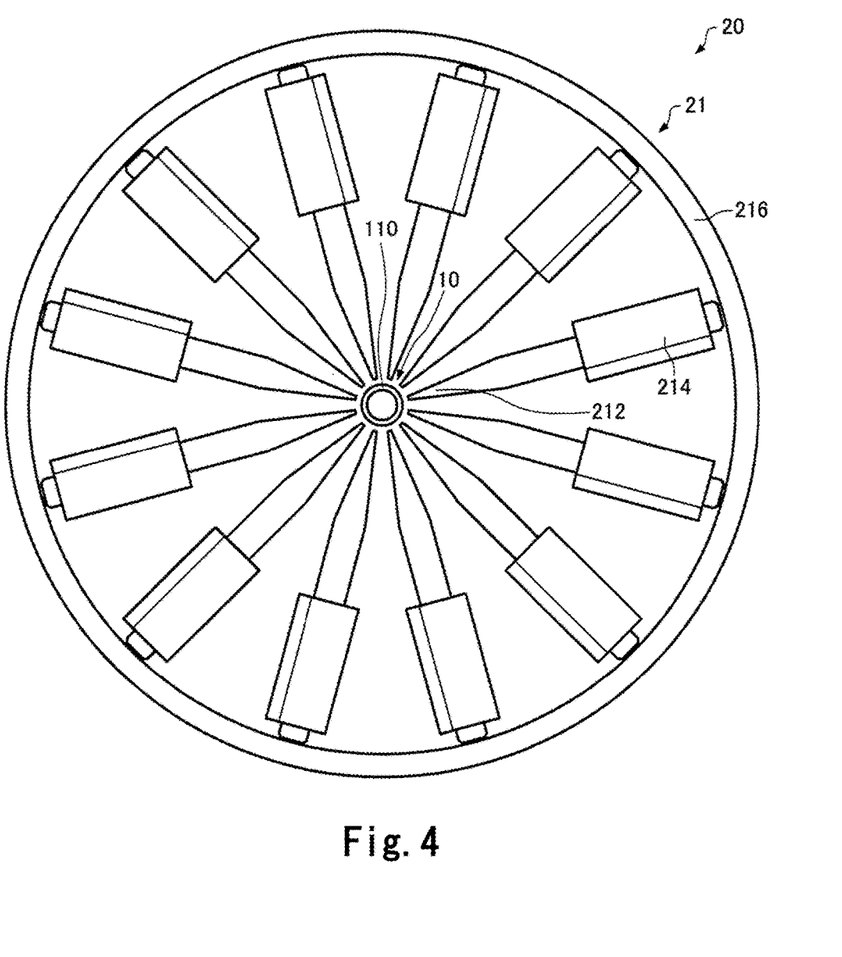
FIG. 4 is a schematic top view of the liner tube and a multipole element of the electron microscope shown in FIG. 1.
Figure 5:
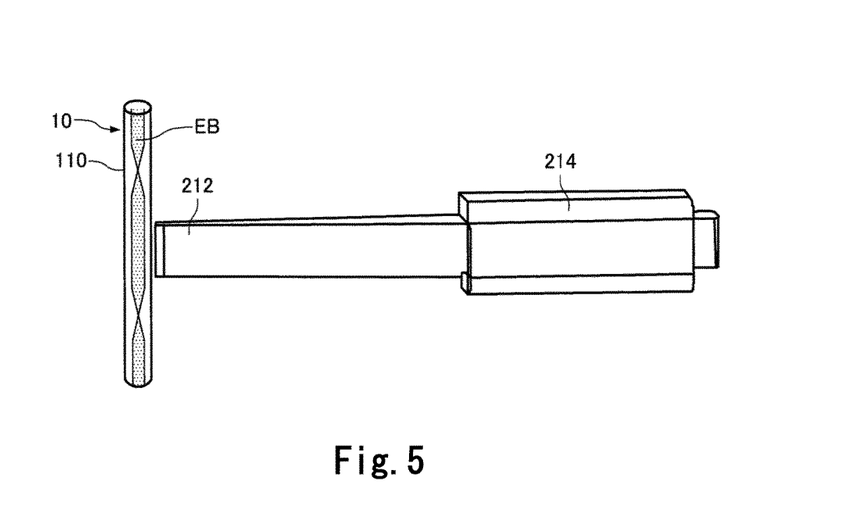
FIG. 5 is a schematic perspective view of the liner tube and multipole element shown in FIG. 4.

FIGS. 4 and 5 are schematic views of the liner tube 10 and the multipole element 21 of the aberration corrector 20. FIG. 4 is a schematic view of the liner tube 10 and multiple element 21, taken from the direction of travel of the electron beam EB. FIG. 5 is a schematic perspective view of the liner tube 10 and multipole element 21, and in which only one of plural polar elements 212 constituting the multipole element 21 is shown for the sake of convenience.

As shown in FIGS. 4 and 5, the aberration corrector 20 has the multipole element 21 consisting of a plurality of (12, in the illustrated example) polar elements 212, coils 214 mounted on the polar elements 212, respectively, and a cylindrical yoke 216. The polar elements 212 are symmetrically arranged about and around the cylindrical member 110 as shown in FIG. 4. The multipole element 21 and coils 214 are disposed outside the cylindrical member 110. The cylindrical member 110 acts as a vacuum partition for isolating a vacuum region that forms a path for the electron beam EB and a non-vacuum region where the multipole element 21 and coils 214 are disposed. The magnetic field produced by the multipole element 21 leaks or oozes out of the cylindrical member 110 and acts on the electron beam EB passing inside the cylindrical member 110.

The material of the cylindrical member 110 is copper, gold, or silver. Preferably, the material is copper. The material of the cylindrical member 110 may also be an alloy consisting principally of one of copper, gold, and silver. For example, the alloy contains 90% or more of copper, gold, or silver. Beryllium copper is preferable among the alloys capable of being used as such material of the cylindrical member 110. The beryllium copper is an alloy of copper with from 0.5% to 3%, inclusively, beryllium. Small amounts of nickel, cobalt, iron, and other metals may also be contained.

Since the cylindrical member 110 is made of copper, gold, silver, or an alloy consisting principally of these metals, the liner tube 10 can have a function of providing a shield against varying magnetic fields in addition to the aforementioned function of acting as a vacuum partition.

Figure 6:
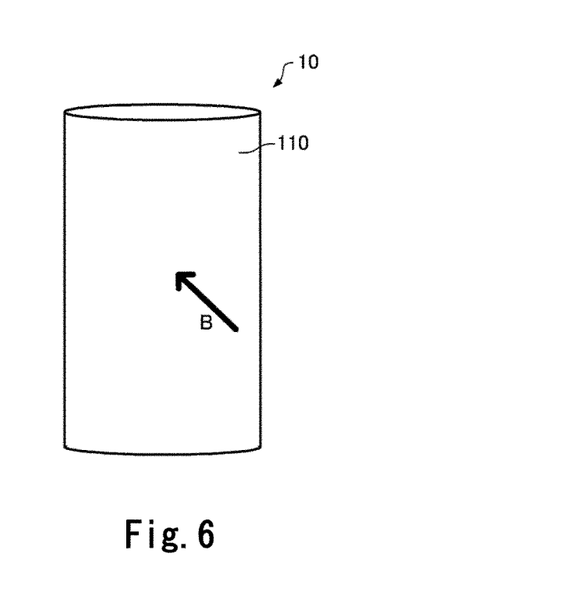
FIGS. 6 and 7 are diagrams for illustrating the shielding effect of the liner tube.
Figure 7:
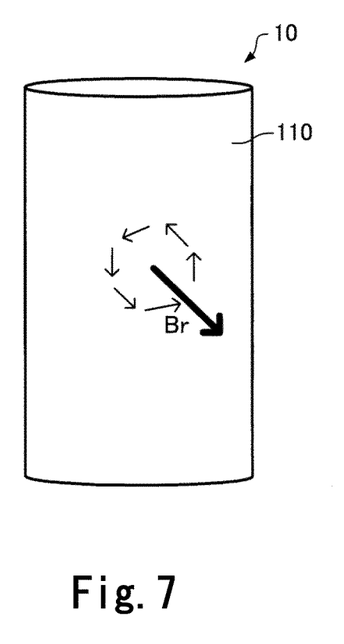

FIGS. 6 and 7 illustrate the shielding effect of the liner tube 10. Where the material of the cylindrical member 110 is copper, gold, or silver, if a varying magnetic field (alternating magnetic field) B is produced outside the cylindrical member 110 as shown in FIG. 6, eddy currents are induced within this metal material by electromagnetic induction. As a result, a magnetic field Br lying in the direction to cancel out the varying magnetic field B is produced. The magnitude of the magnetic field Br increases with reducing the electrical resistivity. Accordingly, where the material of the cylindrical member is copper (having an electrical resistivity of $1.7 \times 10^{-8}$ Ωm (ohm-meters)), gold (having an electrical resistivity of $2.2 \times 10^{-8}$ Ωm (ohm-meters)), or silver (having an electrical resistivity of $1.6 \times 10^{-8}$ Ωm (ohm-meters)), it is possible to provide a more effective shield against the varying magnetic field B, for example, as compared with the case where the material of the cylindrical member is a stainless steel SUS having an electrical resistivity of $7.2 \times 10^{-7}$ Ωm (ohm-meters).

Figure 8:
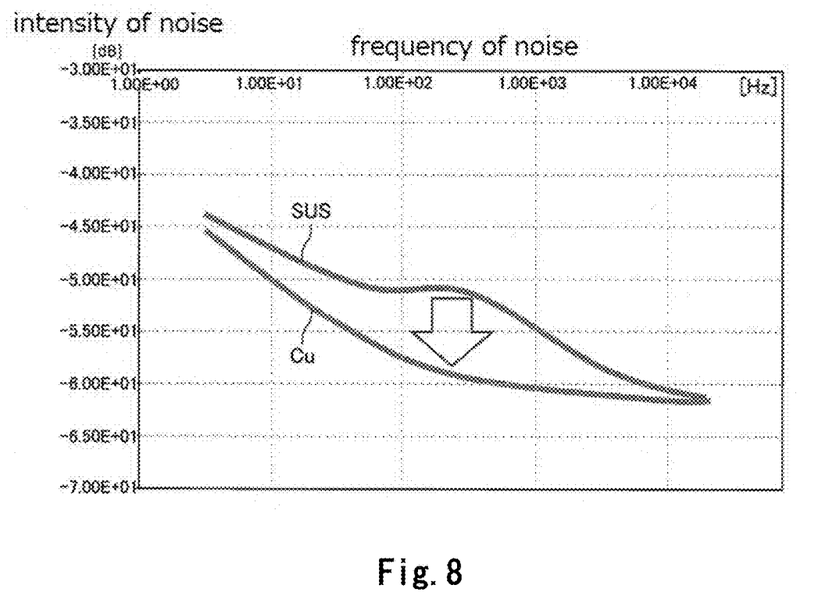
FIG. 8 is a graph illustrating the frequency characteristics of noise produced when a cylindrical member is made of stainless steel and the frequency characteristics of noise produced when the cylindrical member is made of copper.

FIG. 8 is a graph showing the frequency characteristics of noise appearing in an image in a case where the cylindrical member is made of a stainless steel (SUS) and the frequency characteristics of noise appearing in an image where the cylindrical member is made of copper.

As shown in FIG. 8, where the material of the cylindrical member is copper, the level of noise components in the range from $1.00 \times 10$ Hz to $1.00 \times 10^4$ Hz is reduced as compared with the case where the material of the cylindrical member is the stainless steel. Especially, the level of noise components in the range from $1.00 \times 10^2$ Hz to $1.00 \times 10^3$ Hz is greatly reduced. In this way, where the cylindrical member is made of copper, it is possible to provide a more effective shield against RF magnetic fields having frequencies from $1.00 \times 10$ Hz to $1.00 \times 10^4$ Hz, especially $1.00 \times 10^2$ Hz to $1.00 \times 10^3$ Hz, as compared with the case where the cylindrical member is made of the stainless steel.

The relative magnetic permeabilities of copper, gold, and silver are quite close to unity. Therefore, if the material of the cylindrical member is copper, gold, or silver, the magnetic field produced by the multipole element 21 is minimally affected.

Because the cylindrical member 110 is made of copper, gold, or silver, the effects of magnetic field variations, especially magnetic field variations due to an RF magnetic field, on the electron beam can be reduced without affecting the magnetic field generated by the multipole element 21. Also, where the material of the cylindrical member 110 is an alloy consisting chiefly of one of copper, gold, and silver, the same advantageous effects can be obtained as where the cylindrical member 110 is made of copper, gold, or silver.

Furthermore, copper is less expensive than gold and silver. Therefore, the liner tube 10 can be fabricated at low cost by fabricating the cylindrical member 110 from copper. Beryllium copper is a material that has high strength and excellent workability. Consequently, by fabricating the cylindrical member 110 from beryllium copper, the mechanical rigidity of the liner tube 10 can be enhanced. Also, the liner tube 10 can be fabricated easily.

The electron microscope 100 has the following features. In the electron microscope 100, the liner tube 10 has the cylindrical member 110 that is made of copper, gold, silver, or an alloy consisting principally of one of these metals. Therefore, it is possible to provide a more effective shield against varying magnetic fields as described previously, and the effects of magnetic field variations on the electron beam EB can be reduced. In consequence, blurring of the electron beam EB on the sample can be suppressed, and the resolution can be improved.

In the electron microscope 100, the plural polar elements 212 constituting the multipole element 21 are arranged around the cylindrical member 110. Therefore, it is possible to provide a shield, by means of the cylindrical member 110, against RF magnetic fields caused, for example, by (a) disturbing magnetic fields due to ripple in currents exciting the multipole element, (b) external disturbances, and (c) magnetic field variations due to thermal fluctuations in the multipole element. As a consequence, the effects of the magnetic field variations due to the RF magnetic fields on the electron beam EB can be reduced.

Since the electron beam EB takes an optically spread orbit within the multipole element 21, the beam is subject to the effects of noise. In the electron microscope 100, the plural polar elements 212 constituting the multipole element 21 are arranged around the cylindrical member 110 and so the cylindrical member 110 can provide a shield against varying magnetic fields that would otherwise affect the electron beam EB within the multipole element 21. This can reduce the effects of the varying magnetic fields (i.e., noises) on the electron beam EB within the multipole element 21. Hence, the resolution can be improved further.

Figure 9:
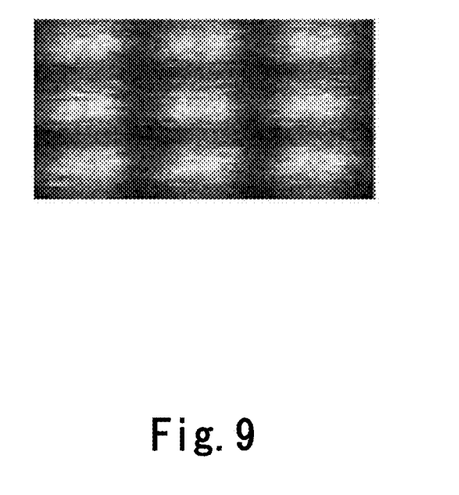
FIG. 9 is an STEM dark-field image obtained when the material of the cylindrical member is stainless steel.
Figure 10:
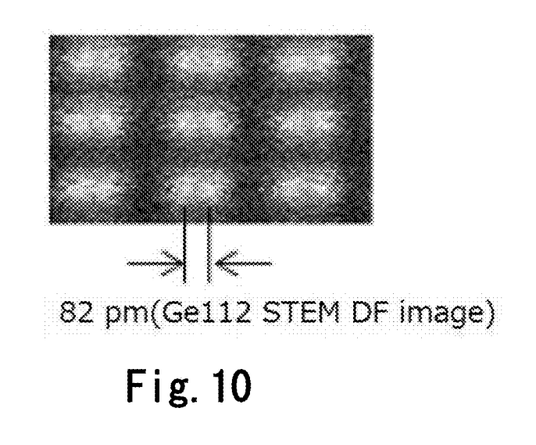
FIG. 10 is an STEM dark-field image obtained when the material of the cylindrical member is copper.

FIG. 9 is an STEM dark-field image taken where the material of the cylindrical member was stainless steel (SUS). FIG. 10 is an STEM dark-field image taken where the material of the cylindrical member was copper. The STEM dark-field images of FIGS. 9 and 10 were taken by observing Ge—Ge dumbbell configurations from the Ge [112] direction. The Ge—Ge distance is 82 pm.

In the STEM dark-field image shown in FIG. 9, Ge—Ge dumbbell configurations cannot be easily noticed. On the other hand, in the STEM dark-field image shown in FIG. 10, Ge—Ge dumbbell configurations can be observed clearly.

In this way, the present embodiment is especially effectively implemented in an electron microscope capable of observations of high resolution (e.g., on the order of 50 pm) in which motions of an electron beam on the order of several pm create noise in an STEM image.

1.2. Modification of Electron Microscope

A modification of the electron microscope associated with the first embodiment is next described by referring to some figures. The electron microscope associated with the present modification is similar in configuration to the electron microscope 100 shown in FIG. 1 and thus is omitted from being shown. However, in the electron microscope associated with the present modification, the liner tube 10 is different in configuration from the liner tube 10 of the electron microscope 100. The electron microscope associated with the present modification is similar in other respects to the above-described electron microscope 100 and thus its description is omitted.

Figure 11:
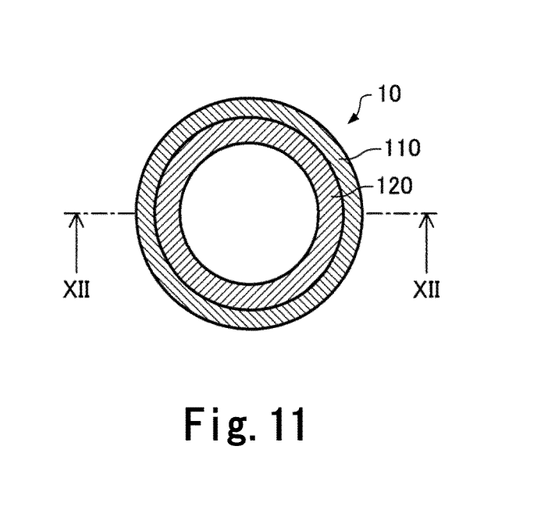
FIG. 11 is a schematic top view in cross section of a liner tube of an electron microscope associated with a modification of the first embodiment.
Figure 12:
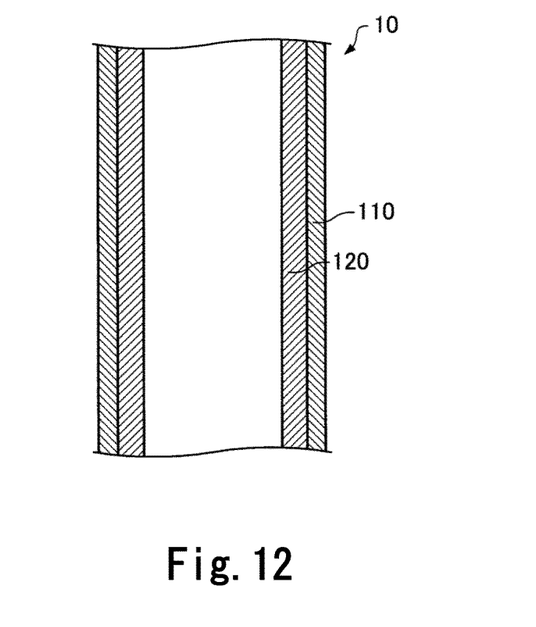
FIG. 12 is a schematic side view in cross section of the liner tube shown in FIG. 11.

FIGS. 11 and 12 are schematic cross sections of the liner tube 10 of the electron microscope associated with the present modification. FIG. 11 corresponds to FIG. 2. FIG. 12 is a cross-sectional view taken on line XII-XII of FIG. 11, and corresponds to FIG. 3.

In the above-described electron microscope 100, the liner tube 10 is made of the cylindrical member (hereinafter may also be referred to as the first cylindrical member) 110 that is fabricated from copper, gold, silver, or an alloy consisting principally of one of these metals as shown in FIGS. 2 and 3.

On the other hand, in the electron microscope associated with the present modification, the liner tube 10 has the first cylindrical member 110 and a second cylindrical member 120 disposed inside the first cylindrical member 110 as shown in FIGS. 11 and 12.

The liner tube 10 has a double structure of the first cylindrical member 110 and the second cylindrical member 120. In the liner tube 10, the interior of the second cylindrical member 120 forms a path for the electron beam EB. The second cylindrical member 120 is made of stainless steel or titanium, for example. Stainless steel and titanium have high strengths and result in less degassing in a vacuum. Also, stainless steel and titanium have high corrosion resistance.

In the electron microscope associated with the present modification, the liner tube 10 has the second cylindrical member 120 disposed inside the first cylindrical member 110. The second cylindrical member 120 is made of stainless steel or titanium. Therefore, in the present modification, there is provided an improved shield against varying magnetic fields, thus reducing the effects of magnetic field variations on the electron beam EB. Furthermore, the mechanical rigidity of the liner tube can be enhanced. In addition, degassing, corrosion, and other undesirable phenomena in vacuum can be prevented.

2. Second Embodiment 2.1. Electron Microscope

Figure 13:
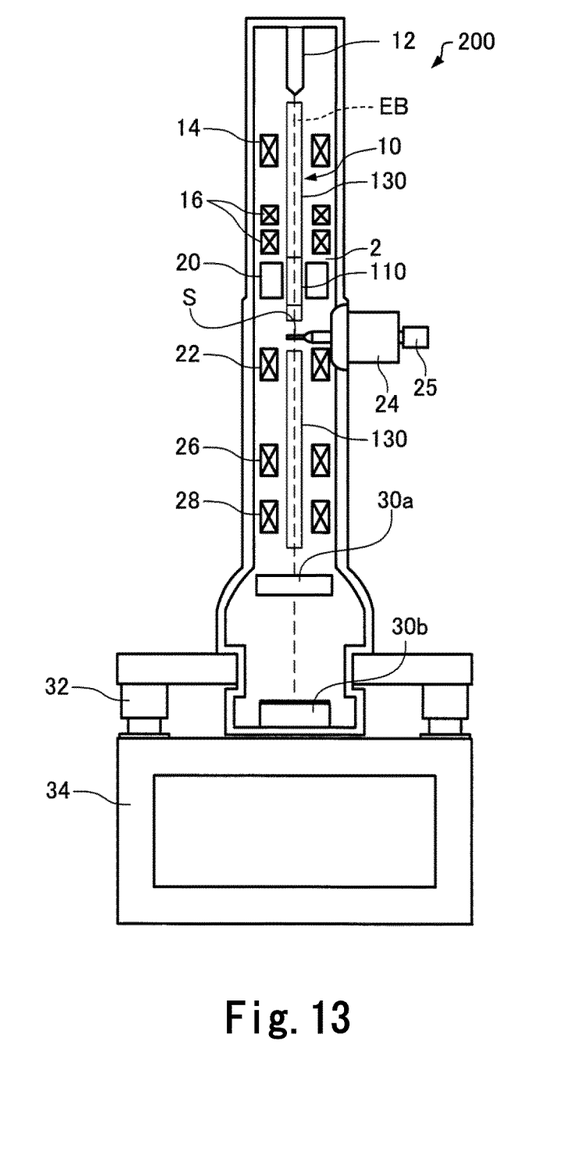
FIG. 13 is a schematic view of an electron microscope associated with a second embodiment.
Figure 14:
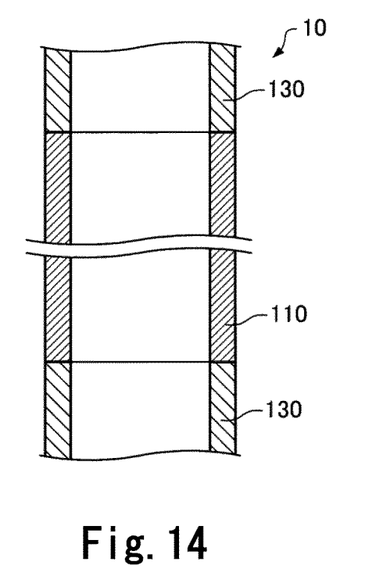
FIG. 14 is a schematic cross-sectional view of a liner tube incorporated in the electron microscope shown in FIG. 13.

An electron microscope associated with a second embodiment is next described by referring to FIGS. 13 and 14. FIG. 13 is a schematic view of the electron microscope, 200, associated with the second embodiment. FIG. 14 is a schematic cross section of the liner tube 10 of the electron microscope 200 associated with the second embodiment, and corresponds to FIG. 3.

Those members of the electron microscope 200 associated with the second embodiment which are similar in function to their respective counterparts of the electron microscope 100 associated with the first embodiment are indicated by the same reference numerals as in the above-referenced figures and a description thereof is omitted.

In the above-described electron microscope 100, the liner tube 10 is made of the first cylindrical member 110 as shown in FIGS. 1-3. In contrast, in the electron microscope 200, as shown in FIGS. 13 and 14, the liner tube 10 has the first cylindrical member 110 around which the polar elements 212 of the multipole element 21 are arranged and a third cylindrical member 130 around which the scan coils 16 are arranged.

The third cylindrical member 130 is made, for example, of stainless steel or titanium. The scan coils 16 produce an RF magnetic field to deflect the electron beam EB, thus scanning the electron probe (electron beam EB) over the sample S. For example, where the cylindrical member around which the scan coils 16 are arranged is made of copper, gold, silver, or an alloy consisting principally of one of these metals, the RF magnetic field emanating from the scan coils 16 is blocked out by the cylindrical member. In this case, the electron probe may not be precisely scanned, so that the image is distorted.

In the liner tube 10, the vicinity of the multipole element 21 is made of the first cylindrical member 110. The vicinities of the scan coils 16 and the vicinities of other component parts are made of the third cylindrical member 130. In the illustrated example of the liner tube 10, the region around which the polar elements 212 of the multipole element 21 are disposed is made of the first cylindrical member 110. The other region including the portion around which the scan coils 16 are arranged is made of the third cylindrical member 130.

In the electron microscope 200, the liner tube 10 has the first cylindrical member 110 made of copper, gold, silver, or an alloy consisting principally of one of these metals and the third cylindrical member 130 made of stainless steel or titanium. The polar elements 212 of the multipole element 21 are arranged around the first cylindrical member 110. The scan coils 16 are arranged around the third cylindrical member 130. Since the material of the third cylindrical member 130 is stainless steel or titanium in this way, the third cylindrical member 130 of the liner tube 10 provides no shield against the RF magnetic field generated by the scan coils 16 for scanning of the electron probe. This permits the electron beam (electron probe) to be scanned precisely. Therefore, in the electron microscope 200, the electron probe can be scanned precisely, and the effects of the RF magnetic field emanating from the multipole element on the electron beam EB can be reduced.

In the electron microscope 200, if component parts that produce an RF magnetic field are present within the electron optical column 2 besides the multipole element 21, the vicinities of these component parts of the liner tube 10 may be made of the first cylindrical member 110 in an unillustrated manner. Also, a portion of the liner tube 10 that surrounds the region where the electron beam EB takes an optically spread orbit may be made of the first cylindrical member 110 because this region is subject to the effects of noise as mentioned previously.

2.2. Modification of Electron Microscope

Figure 15:
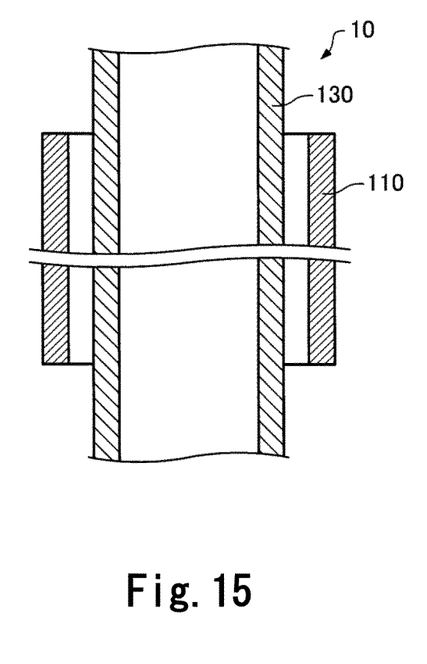
FIG. 15 is a schematic cross-sectional view of a liner tube of an electron microscope associated with a modification of the second embodiment.
Figure 16:
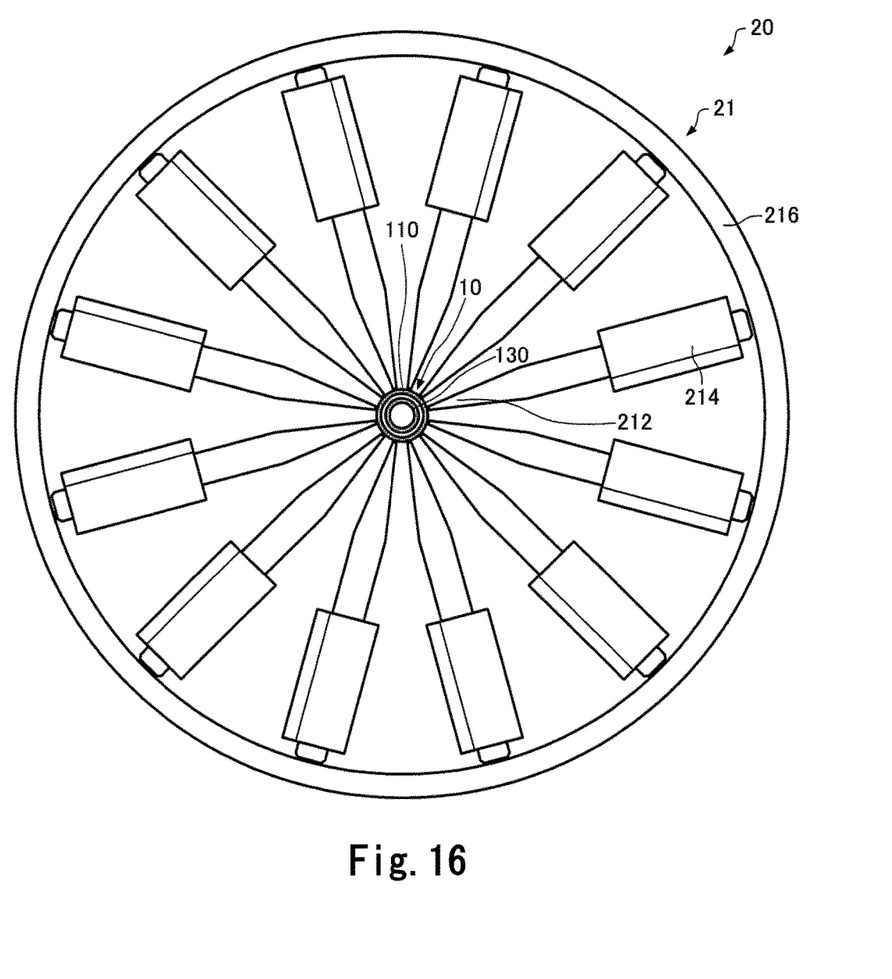
FIG. 16 is a schematic top view of the liner tube and a multipole element of the electron microscope shown in FIG. 15.
Figure 17:
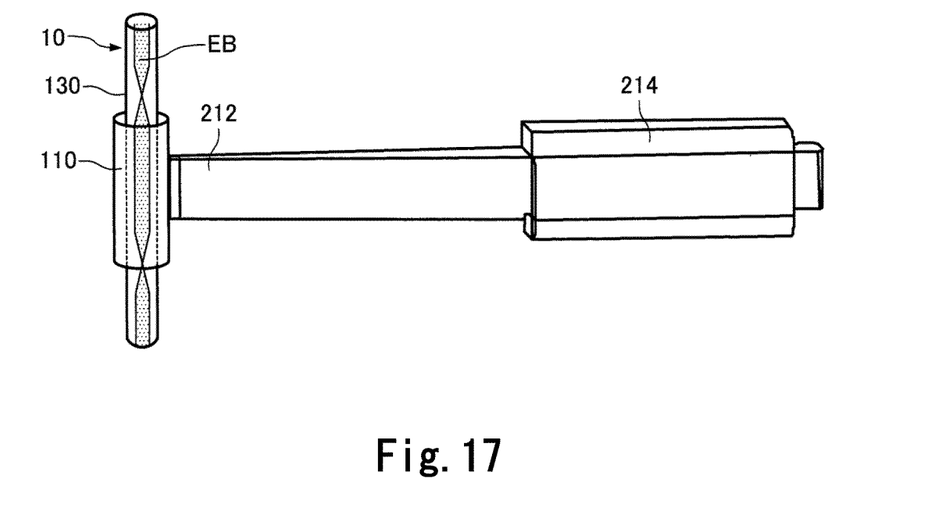
FIG. 17 is a schematic side elevation of the liner tube and multipole element shown in FIG. 16.

A modification of the electron microscope associated with the second embodiment is next described by referring to FIGS. 15-17. The electron microscope associated with the present modification is similar in configuration to the electron microscope 200 shown in FIG. 13 and thus is omitted from being shown in the following figures. In the electron microscope associated with the present modification, the liner tube 10 is different in configuration to the liner tube 10 of the electron microscope 200. Since the electron microscope associated with the present modification is similar in other respects to the above-described electron microscope 200, a description of such similarities is omitted.

FIG. 15 is a schematic cross section of the liner tube 10 of the electron microscope associated with the present modification, and corresponds to FIG. 14. FIGS. 16 and 17 are schematic views of the liner tube 10 of the electron microscope associated with the present modification and the multipole element 21 of the aberration corrector 20. FIGS. 16 and 17 correspond to FIGS. 4 and 5, respectively.

In the electron microscope associated with the present modification, the liner tube 10 has the first cylindrical member 110 and the third cylindrical member 130 as shown in FIGS. 15-17. Parts of the first cylindrical member 110 and third cylindrical member 130 together form a double structure.

The third cylindrical member 130 is disposed inside the first cylindrical member 110 in the vicinity of the multipole element 21 around which the polar elements 212 of the multipole element 21 of the liner tube 10 are arranged, thus forming the double structure. In the illustrated example, only the portions of the multipole element 21 around which the polar elements 212 of the multipole element 21 of the liner tube 10 are arranged contribute to the formation of the double structure.

The first cylindrical member 110 is placed in contact with the polar elements 212 of the multipole element 21. The first cylindrical member 110 is inserted and fitted in the region surrounded by the polar elements 212 of the multipole element 21. The first cylindrical member 110 is supported by the polar elements 212. A gap may be present between the first cylindrical member 110 and third cylindrical member 130 as shown.

The electron microscope associated with the present modification can yield advantageous effects similar to those produced by the above-described electron microscope 200.

It is to be understood that the above-described embodiments and modifications are merely exemplary and that the invention is not restricted thereto. For example, the embodiments and modifications may be combined appropriately.

In the above embodiments, as shown in FIGS. 1 and 13, the aberration corrector 20 is an aberration corrector for the illumination system. The present invention can be similarly applied to an aberration corrector for the imaging system.

Furthermore, in the above embodiments, the aberration corrector 20 is a spherical aberration corrector for correcting spherical aberration. The present invention is also applicable to other aberration corrector (such as a chromatic aberration corrector) for correcting aberrations by the use of at least one multipole element.

The present invention embraces configurations substantially identical (e.g., in function, method, and results or in purpose and advantageous effects) with the configurations described in the embodiments of the invention. Furthermore, the invention embraces configurations described in the embodiments and including portions which have non-essential portions replaced. In addition, the invention embraces configurations which produce the same advantageous effects as those produced by the configurations described in the embodiments or which can achieve the same objects as the configurations described in the embodiments. Further, the invention embraces configurations which are similar to the configurations described in the embodiments except that well-known techniques have been added.

Having thus described our invention with the detail and particularity required by the Patent Laws, what is desired protected by Letters Patent is set forth in the following claims.

The invention claimed is:

1. A liner tube disposed inside an electron optical column of an electron microscope and having an interior providing an elongate path for an electron beam, said liner tube separating an inner vacuum region and an outer non-vacuum region where electron optical elements that generate magnetic fields to affect the electron beam are disposed, said liner tube comprising:

a first cylindrical member made of copper, gold, silver, or an alloy consisting principally of one of these metals.

2. The liner tube as set forth in claim 1, wherein a second cylindrical member is disposed inside said first cylindrical member and made of stainless steel or titanium.

3. The liner tube as set forth in claim 1, wherein said first cylindrical member is made of copper or beryllium copper.

4. An electron microscope having an electron optical column in which a liner tube is disposed, the liner tube having an interior providing an elongate path for an electron beam, said liner tube separating an inner vacuum region and an outer non-vacuum region where electron optical elements that generate magnetic fields to affect the electron beam are disposed, wherein said liner tube has a first cylindrical member made of copper, gold, silver, or an alloy consisting principally of one of these metals.

5. The electron microscope as set forth in claim 4, further comprising an aberration corrector equipped with a multipole element, wherein said multipole element has a plurality of polar elements arranged around said first cylindrical member.

6. The electron microscope as set forth in claim 4, wherein said liner tube has a second cylindrical member disposed inside said first cylindrical member, and wherein the second cylindrical member is made of stainless steel or titanium.

7. The electron microscope as set forth in claim 4, further comprising scan coils for scanning said electron beam, wherein said liner tube has a third cylindrical member made of stainless steel or titanium, and wherein the scan coils are arranged around the third cylindrical member.

8. The electron microscope as set forth in claim 4, wherein said first cylindrical member is made of copper or beryllium copper.

* * * * *